United States Patent
Sakai

(10) Patent No.: US 8,642,897 B2
(45) Date of Patent: Feb. 4, 2014

(54) WIRING BOARD AND METHOD FOR MANUFACTURING THE SAME

(75) Inventor: Shunsuke Sakai, Ogaki (JP)

(73) Assignee: Ibiden Co., Ltd., Ogaki-shi (JP)

( * ) Notice: Subject to any disclaimer, the term of this patent is extended or adjusted under 35 U.S.C. 154(b) by 73 days.

(21) Appl. No.: 13/218,968

(22) Filed: Aug. 26, 2011

(65) Prior Publication Data

US 2012/0085572 A1    Apr. 12, 2012

Related U.S. Application Data

(60) Provisional application No. 61/392,201, filed on Oct. 12, 2010.

(51) Int. Cl.
*H05K 1/16* (2006.01)

(52) U.S. Cl.
USPC .............................. 174/260; 174/262; 29/832

(58) Field of Classification Search
None
See application file for complete search history.

(56) References Cited

U.S. PATENT DOCUMENTS

| | | | | |
|---|---|---|---|---|
| 7,507,915 B2* | 3/2009 | Chang et al. | .................. | 174/260 |
| 7,849,591 B2* | 12/2010 | Okamoto et al. | ............... | 29/832 |
| 2010/0078205 A1 | 4/2010 | Sakai et al. | | |
| 2010/0300737 A1 | 12/2010 | Sato et al. | | |
| 2011/0240354 A1 | 10/2011 | Furuhata et al. | | |

FOREIGN PATENT DOCUMENTS

JP    2009-081367    4/2009

* cited by examiner

*Primary Examiner* — Ishwarbhai Patel
(74) *Attorney, Agent, or Firm* — Oblon, Spivak, McClelland, Maier & Neustadt, L.L.P.

(57) ABSTRACT

A wiring board including a core substrate having an accommodation portion, an electronic component in the accommodation portion having a substrate, a resin layer on a surface of the substrate and an electrode on the resin layer, a first interlayer resin insulation layer on a surface of the core substrate and a surface of the substrate of the component, and a second interlayer resin insulation layer on the opposite surface of the core substrate and a surface of the substrate having the resin layer and electrode. The first insulation layer has resin in the amount greater than the amount of resin in the second insulation layer such that the total amount of resin component including the resin in the first insulation layer is adjusted to be substantially the same as the total amount of resin component including the resin in the second insulation layer and resin in the resin layer.

20 Claims, 14 Drawing Sheets

| Sample | | #1 | #2 |
|---|---|---|---|
| Thickness of Layer (μm) | 1st Interlayer Resin Insulation Layer | 42.34 | 27.44 |
| | 2nd Interlayer Resin Insulation Layer | 28.68 | 27.06 |
| Warping (μm) | 25°C (Heated) | 34 | 50 |
| | 180°C (Heated) | 14 | 36 |
| | 260°C | 18 | 33 |
| | 180°C (Cooled) | 24 | 35 |
| | 25°C (Cooled) | 37 | 58 |

WIRING BOARD AND METHOD FOR MANUFACTURING THE SAME

CROSS-REFERENCE TO RELATED APPLICATIONS

The present application claims the benefits of priority to U.S. Application No. 61/392,201, filed Oct. 12, 2010. The contents of that application are incorporated herein by reference in their entirety.

BACKGROUND OF THE INVENTION

1. Field of the Invention

The present invention relates to a wiring board with a built-in electronic component and to a method for manufacturing such a wiring board.

2. Discussion of the Background

In Japanese Laid-Open Patent Publication No. 2009-81367, a wiring board with a built-in electronic component is disclosed. Such a wiring board accommodates an electronic component where wiring is formed only on one surface. Interlayer resin insulation layers made of resin material are respectively formed on both sides of an electronic component in a wiring board described in Japanese Laid-Open Patent Publication No. 2009-81367. In addition, the electronic component has an insulation layer made of resin material. The contents of Japanese Laid-Open Patent Publication No. 2009-81367 are also incorporated herein by reference in their entirety in this application.

SUMMARY OF THE INVENTION

According to one aspect of the present invention, a wiring board includes a core substrate having an accommodation portion and having a first surface and a second surface on the opposite side of the first surface, an electronic component accommodated in the accommodation portion of the core substrate, the electronic component having a substrate, a resin layer formed on a surface of the substrate and an electrode formed on the resin layer, a first interlayer resin insulation layer formed on the first surface of the core substrate and a surface of the substrate of the electronic component, and a second interlayer resin insulation layer formed on the second surface of the core substrate and a surface of the substrate having the resin layer and electrode of the electronic component. The first interlayer resin insulation layer has a resin in the amount which is greater than the amount of a resin in the second interlayer resin insulation layer such that the total amount of a resin component including the resin in the first interlayer resin insulation layer is adjusted to be substantially the same as the total amount of a resin component including the resin in the second interlayer resin insulation layer and a resin in the resin layer of the electronic component.

According to another aspect of the present invention, a method for manufacturing a wiring board includes forming an accommodation portion in a core substrate, accommodating an electronic component having a substrate, a resin layer on a surface of the substrate and an electrode formed on the resin layer, forming an insulation layer for a first interlayer resin insulation layer on a surface of the core substrate without the resin layer and electrode of the electronic component, forming an insulation layer for a second interlayer resin insulation layer on a surface of the core substrate with the resin layer and electrode of the electronic component, curing the insulation layer for the first interlayer resin insulation layer, and curing the insulation layer for the second interlayer resin insulation layer. The insulation layer for the first interlayer resin insulation layer has a resin in the amount which is greater than the amount of a resin in the insulation layer for the second interlayer resin insulation layer such that the total amount of a resin component including the resin in the first interlayer resin insulation layer is adjusted to be substantially the same as the total amount of a resin component including the resin in the second interlayer resin insulation layer and a resin in the resin layer of the electronic component.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE EMBODIMENTS

Figure 1A:
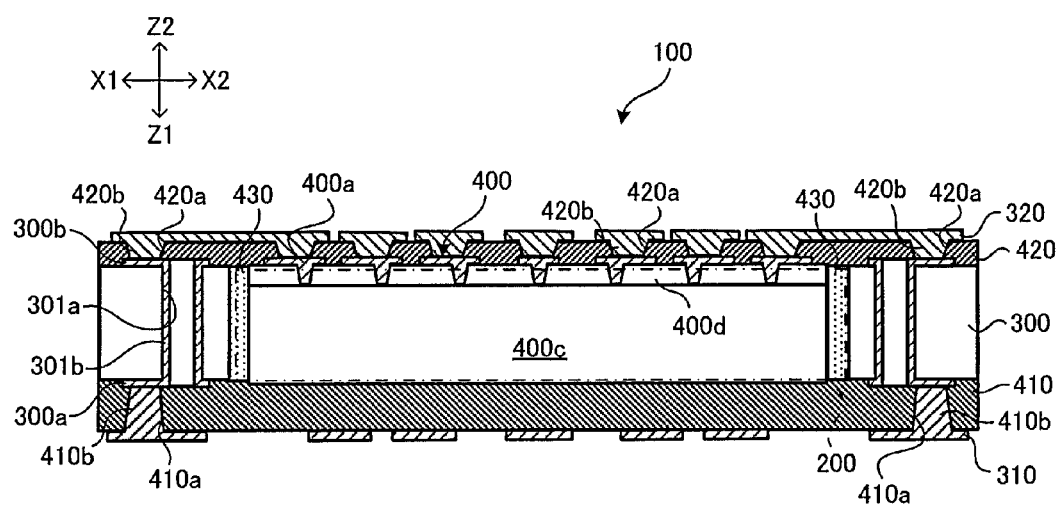
FIG. 1A is a cross-sectional view of a wiring board according to the first embodiment of the present invention.

The embodiments will now be described with reference to the accompanying drawings, wherein like reference numerals designate corresponding or identical elements throughout the various drawings.

In the drawings, arrows (Z1, Z2) each indicate a lamination direction in a wiring board corresponding to a direction along a normal line (or a direction of the thickness of a core substrate) to the main surfaces (upper and lower surfaces) of the wiring board. On the other hand, arrows (X1, X2) each indicate a direction perpendicular to a lamination direction (directions parallel to the main surfaces of the wiring board). The main surfaces of the wiring board are on the X-Y plane. Side surfaces of the wiring board are on the X-Z plane or the Y-Z plane.

Regarding connection conductors or their holes, a cross section perpendicular to directions Z (X-Y plane) is referred to as a horizontal cross section. Also, a cross section parallel to directions Z (X-Z plane or Y-Z plane) is referred to as a vertical cross section.

Other than a layer that includes a conductive pattern functioning as wiring such as circuits (including ground), a layer formed only with a plain pattern is also referred to as a wiring layer. In such a wiring layer, lands of filled conductors may also be included in addition to the conductive pattern.

Plating means depositing a layer of conductor (such as metal) on surfaces of metal, resin or the like as well as the deposited conductive layer (such as a metal layer). Plating includes wet plating such as electrolytic plating and electroless plating as well as dry plating such as PVD (physical vapor deposition) and CVD (chemical vapor deposition).

The "width" of a hole or a column (protrusion), unless otherwise indicated, means the diameter if it is a circle and $2\sqrt{\text{(cross section}/\pi)}$ if it is other than a circle.

FIG. 1A shows wiring board 100 of the first embodiment of the present invention. As shown in FIG. 1A, wiring board 100 has core substrate 300, wiring layers (310, 320) as conductive patterns and electronic component 400. Wiring board 100 has space (opening) 200 shaped to correspond to the external shape of electronic component 400. Electronic component 400 is accommodated in space 200. Space 200 is also referred to as an accommodation section to accommodate electronic component 400. The thickness of wiring layer (300a) and the thickness of wiring layer (300b) are each between 12 μm and 70 μm.

Electronic component 400 is formed with substrate (400c) having an upper surface (the pad-side surface) and a lower surface opposite the upper surface (the non-pad side surface), resin layer (400d) formed on the upper surface of substrate (400c) and electrodes (400a) on resin layer (400d). Substrate (400c) is made of silicon or germanium, for example.

As for electronic component 400 of the present embodiment, a component in which resin layer (400d) and electrodes (400a) on resin layer (400d) are formed on an IC, for example, is included. Also, a component in which a rewiring layer is formed on an IC is included as electronic component 400 of the present embodiment. Moreover, protective film having openings to expose electrodes (400a) may be formed on resin layer (400d) and electrodes (400a). The surfaces of electrodes (400a) may be roughened. Alternatively, a wafer-level CSP, obtained through procedures performed on a wafer such as forming passivation film, die pads or the like, further rewiring and so forth, and then by cutting the wafer into individual units, is also included as electronic component 400.

Electronic component 400 may have substantially the same thickness as core substrate 300, may be thicker than core substrate 300 or may be thinner than core substrate 300. In the first embodiment, the thickness of core substrate 300 and the thickness of electronic component 400 are substantially the same. Thus, wiring board 100 tends to be made thinner. Also, compared with a situation in which the thickness of electronic component 400 is less than that of core substrate 300, since substrate (400c) of electronic component 400 is thicker, wiring board 100 (printed wiring board) tends to have higher rigidity. Accordingly, in the first embodiment, wiring board 100 (printed wiring board) which accommodates electronic component 400 becomes thinner, while the amount of warping in wiring board 100 tends to be less.

Core substrate 300 is made of epoxy resin, for example. Core substrate 300 is preferred to be made of epoxy resin and reinforcing material such as glass fiber or aramid fiber. The reinforcing material has a smaller thermal expansion coefficient than the primary material (epoxy resin).

The thickness of core substrate 300 (in the direction of arrows Z1-Z2) is 0.06 mm to 0.4 mm, for example. The size of core substrate 300 (on the X-Y plane) is 7 mm×7 mm to 18 mm×18 mm, for example. Core substrate 300 is shaped as a rectangle. In addition, the size of electronic component 400 (on the X-Y plane) is 5 mm×5 mm to 16 mm×16 mm, for example. Electronic component 400 is shaped as a rectangle.

The thickness of core substrate 300 in the first embodiment is 0.1 mm. The size of core substrate 300 in the first embodiment is 11 mm×11 mm. The size of electronic component 400 in the first embodiment is 8 mm×8 mm. In the first embodiment, the thickness of electronic component 400 and the thickness of core substrate 300 are substantially the same.

Figure 1B:
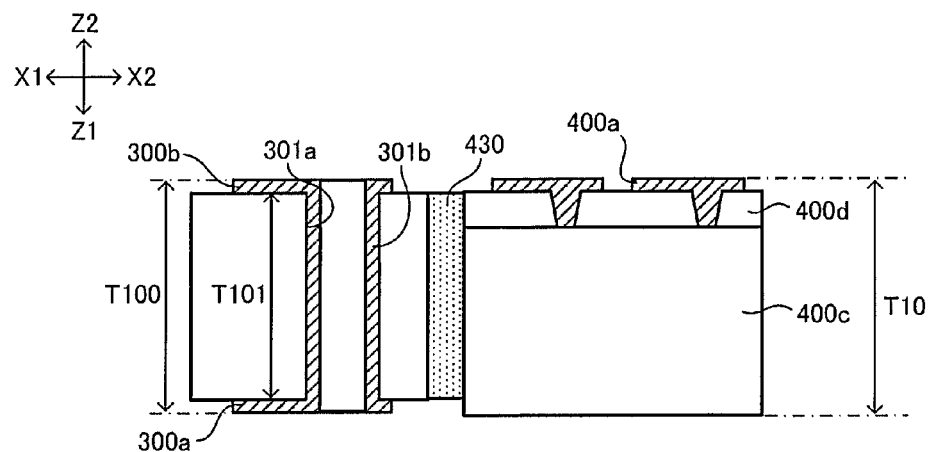
FIG. 1B is a magnified cross-sectional view showing part of the wiring board according to the first embodiment of the present invention.

FIG. 1B is a magnified view showing part of wiring board 100 in the first embodiment. As shown in FIG. 1B, the thickness of core substrate 300 corresponds to distance (T101), which is from the first surface of core substrate 300 to the second surface. The sum of thickness (T101) of core substrate 300 and the thickness of first conductive circuits (wiring layer 300a) and the thickness of second conductive circuits (wiring layer 300b) is (T100). The thickness of electronic component 400 in the first embodiment is distance (T10), which is from the top surfaces of electrodes (400a) to the lower surface of substrate (400c). (T10)/(T100) is in the range of 0.5~1.2. If (T10)/(T100) is smaller than 0.5, electronic component 400 may be damaged due to warping in wiring board 100. If (T10)/(T100) exceeds 1.2, since the portion of electronic component 400 which protrudes from core substrate 300 increases, the flatness of the interlayer resin insulation layer on electronic component 400 decreases. As a result, it is hard to form a wiring layer on that portion. Also, the wiring layer on resin filler 430 may easily break.

Figure 2A:
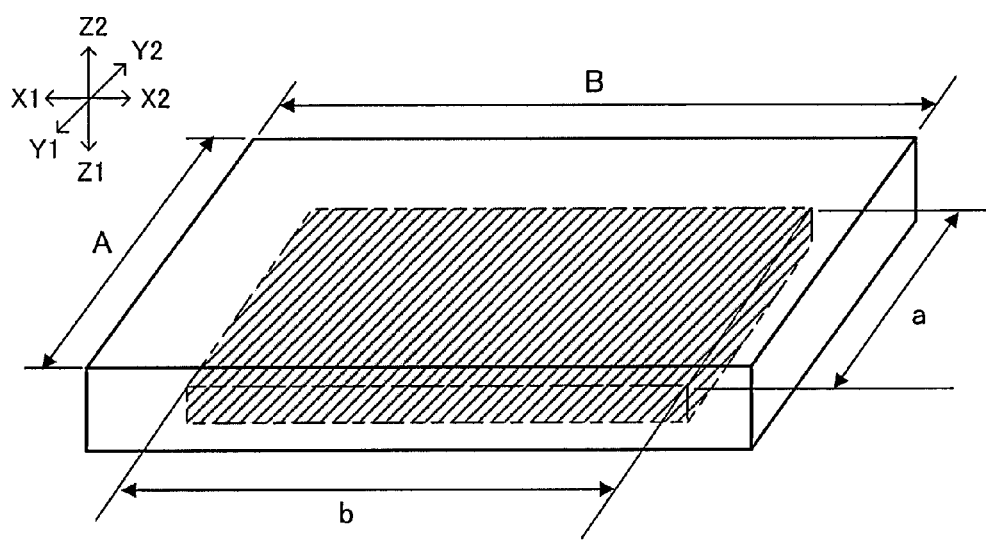
FIG. 2A is a view showing the relationship between an electronic component accommodated in a wiring board and a core substrate.

In the present embodiment, the area percentage of core substrate 300 which accommodates electronic component 400 and is occupied by electronic component 400 is approximately 90% (the area of electronic component (a×b)/the area of core substrate 300 (A×B)) (see FIG. 2A). However, it is sufficient if the area percentage is in the range of 50% to 90%. The greater the area percentage, the more often warping occurs in wiring board 100. Here, the shape, thickness, material and so forth of core substrate 300 may be modified freely depending on usage requirements or the like.

Through holes (301a) are formed in core substrate 300. Through-hole conductors (301b) are formed on inner walls of through holes (301a). In addition, space 200 is formed in core substrate 300 so as to correspond to the external shape of electronic component 400.

Wiring layers (300a, 300b) are respectively formed on the first surface and second surface of core substrate 300. The first surface and the second surface face each other. Wiring layer (300a) is formed on the first surface of core substrate 300 and is made up of multiple first conductive circuits. Wiring layer (300b) is formed on the second surface of core substrate 300 and is made up of multiple second conductive circuits. Wiring layer (300a) and wiring layer (300b) are electrically connected by through-hole conductors (301b). The thicknesses of wiring layers (300a, 300b) in the first embodiment are each 12 μm.

First interlayer resin insulation layer 410 and wiring layer 310 are laminated in that order on the first surface of core substrate 300 (the arrow-Z1 side surface). Wiring layer 310 is made up of multiple third conductive circuits. In addition, second interlayer resin insulation layer 420 and wiring layer 320 are laminated in that order on the second surface of core substrate 300 (the arrow-Z2 side surface). Wiring layer 320 is made up of multiple fourth conductive circuits. First and second interlayer resin insulation layers (410, 420) are made of resin such as epoxy and inorganic particles such as silica. As for the alternatives, an example made of resin such as epoxy resin and reinforcing material such as glass cloth, another example made of resin such as epoxy resin, reinforcing material such as glass cloth and inorganic particles such as silica, and the like may be listed. Also, wiring layers (310, 320) are made of copper-plated film, for example.

Electronic component 400 is positioned in space 200 so that the lower surface of substrate (400c) of the electronic component faces the same direction (the Z1 side) as the first surface of core substrate 300. The gap between electronic component 400 and core substrate 300 is filled with resin filler 430 made of resin and inorganic filler. Alternatively, the resin and inorganic particles contained in first or second interlayer resin insulation layer 410 or 420 may seep into the gap between electronic component 400 and core substrate 300 to fill the gap.

First interlayer resin insulation layer 410 is formed on the second surface of electronic component 400, the first surface of core substrate 300 and the first conductive circuits (wiring layer 300a), and covers the second surface of electronic component 400. The second surface of electronic component 400 is the same as the lower surface of substrate (400c) (the non-pad side surface). The first surface of electronic component 400 is opposite the second surface of electronic component 400, and the electrodes are formed on that surface (the pad-side surface). Via holes (410a) reaching wiring layer (300a) are formed in predetermined spots of first interlayer resin insulation layer 410. First via conductors (410b) are formed on the wall and bottom surfaces of via holes (410a). First via conductors (410b) may also be filled vias formed by filling via holes (410a) with plated film. Wiring layer (300a) and wiring layer 310 are electrically connected by first via conductors (410b).

On the other hand, second interlayer resin insulation layer 420 is formed on the second surface of core substrate 300, on second conductive circuits (wiring layer 300b) and on the first surface of electronic component 400, and covers the first surface of electronic component 400. Via holes (420a) reaching wiring layer (300b) and electrodes (400a) are formed in predetermined spots of second interlayer resin insulation layer 420. Second via conductors (420b) are formed on the wall and bottom surfaces of via holes (420a). Second via conductors (420b) may also be filled vias formed by filling via holes (420a) with plated film. Wiring layer (300b) and wiring layer 320, as well as electrodes (400a) and wiring layer 320, are electrically connected by second via conductors (420b). Wiring layer 320 and second via conductors (420b) are made of copper-plated film, for example.

Electronic component 400 is surrounded with resin filler 430 and first and second interlayer resin insulation layers (410, 420). Accordingly, electronic component 400 is protected by resin filler 430 and first and second interlayer resin insulation layers (410, 420), and is fixed to a predetermined position.

Figure 2B:
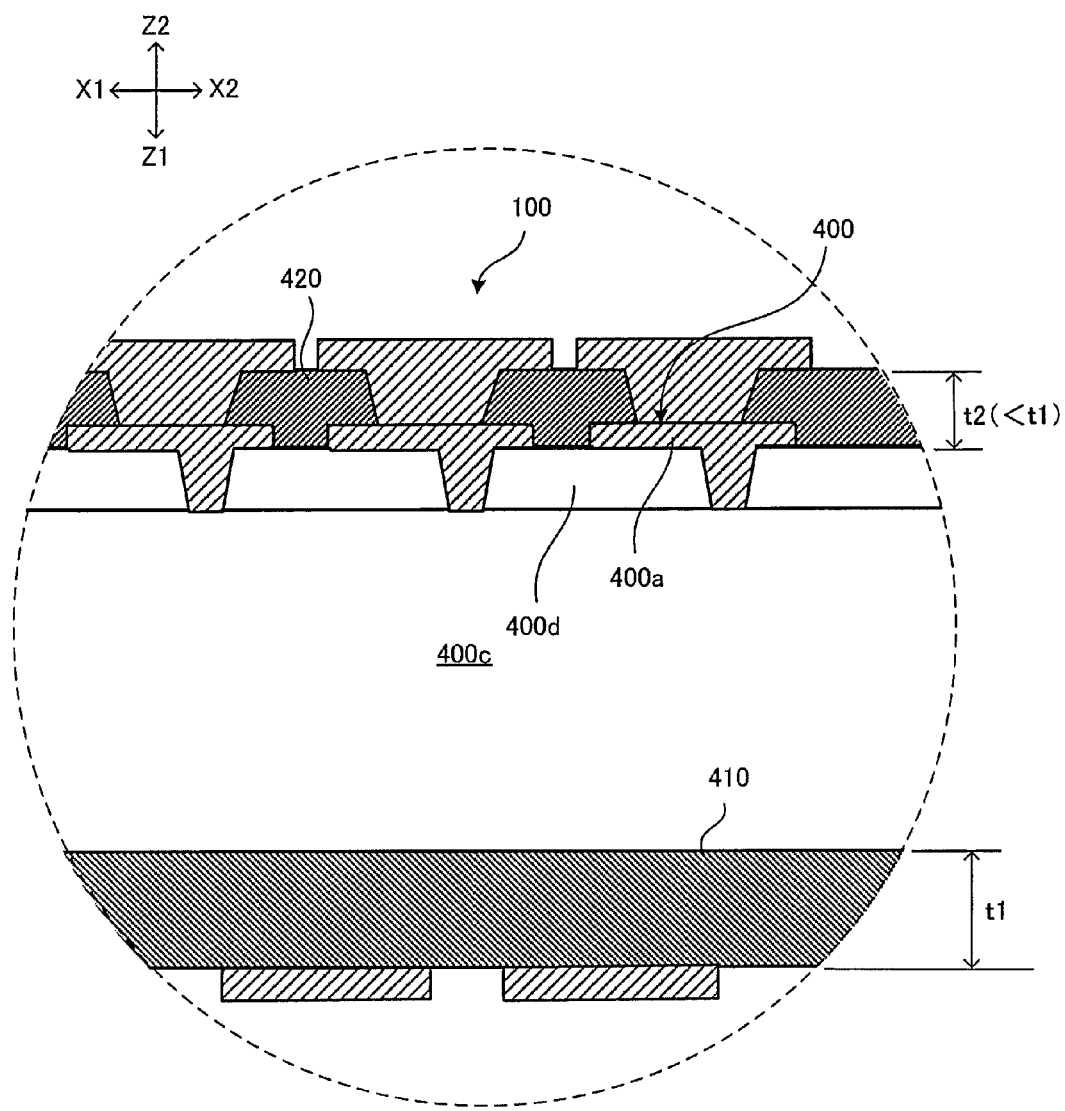
FIG. 2B is a magnified view of an electronic component accommodated in a wiring board.

FIG. 2B is a view partially magnifying the surroundings of electronic component 400. Thickness (t2) of second interlayer resin insulation layer 420 on the first surface of electronic component 400 is set smaller than thickness (t1) of first interlayer resin insulation layer 410 on the second surface of electronic component 400 (t2<t1). As a result, since the resin formed on substrate (400c) of electronic component 400 corresponds to resin layer (400d) and second interlayer resin insulation layer 420, the amount of resin existing on the upper surface of substrate (400c) of electronic component 400 is substantially the same as the amount of resin existing on the lower surface of substrate (400c) of electronic component 400.

Accordingly, even if curing contraction occurs in resin, since the amount of curing contraction is substantially the same on one side of electronic component 400 as on the other side, warping is suppressed in wiring board 100. In addition, since the amount of curing contraction in first interlayer resin insulation layer 410 is greater than that in second interlayer resin insulation layer 420, warping occurring because of electronic component 400, which has resin layer (400d) on the upper surface of substrate (400c) and is built into core substrate 300 is corrected. Here, the thermal contraction coefficients of the resin material in first interlayer resin insulation layer 410 and second interlayer resin insulation layer 420 are substantially the same.

Figures 3A, 3B:
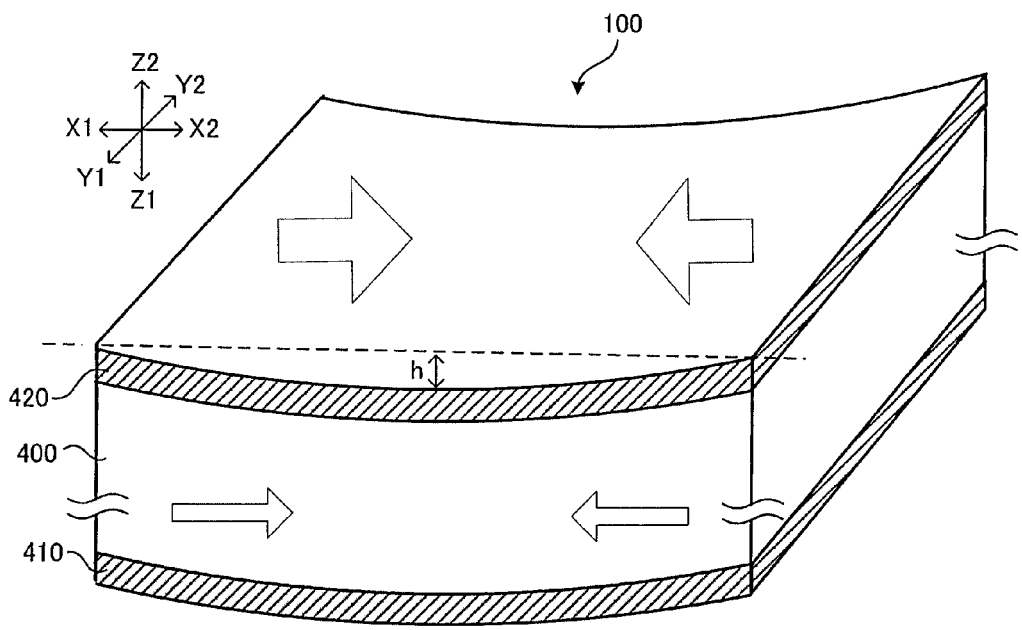
FIG. 3A is a table showing the amounts of warping in wiring boards.
FIG. 3B is a view schematically showing how a wiring board warps.

FIG. 3A shows the behavior (warping) of wiring board 100 caused by curing contraction. The thickness of first interlayer resin insulation layer 410 used in wiring board 100 of sample #1 is greater than that of second interlayer resin insulation layer 420. On the other hand, the thickness of first interlayer resin insulation layer 410 used in wiring board 100 of sample #2 is substantially the same as that of second interlayer resin insulation layer 420. In the wiring board of sample #1, the thickness of first interlayer resin insulation layer 410 is 42.34 μm and the thickness of second interlayer resin insulation layer 420 is 28.68 μm. In the wiring board of sample #2, the thickness of first interlayer resin insulation layer 410 is 27.44 μm and the thickness of second interlayer resin insulation layer 420 is 27.06 μm.

First, sample #1 and sample #2 having the above structures are heated to 25° C., then heated to 180° C., and further heated to 260° C. Then, sample #1 and sample #2 are cooled to 180° C., and further cooled to 25° C. FIG. 3A shows the amount of warping in wiring boards 100 at each temperature. From FIG. 3A, it is found that the amount of warping in wiring board 100 of sample #1 is smaller than the amount of warping in the wiring board of sample #2 at each temperature.

Here, the amount of warping in FIG. 3A is the value indicating maximum distance "h" (see FIG. 3B) between the virtual line connecting both ends of wiring board 100 and the top surface of wiring board 100 (the Z2-side surface).

The amount of warping at each temperature is as follows. Namely, at 25° C. (heated), the amount of warping in wiring board 100 of sample #1 is 34 μm, whereas the amount of warping in the wiring board of sample #2 is 50 μm; at 180° C. (heated), the amount of warping in wiring board 100 of sample #1 is 14 μm, whereas the amount of warping in the wiring board of sample #2 is 36 μm; and at 260° C., the amount of warping in wiring board 100 of sample #1 is 18 μm, whereas the amount of warping in the wiring board of sample #2 is 33 μm. Moreover, at 180° C. (cooled), the amount of warping in wiring board 100 of sample #1 is 24 μm, whereas the amount of warping in the wiring board of sample #2 is 35 μm; and at 25° C. (cooled), the amount of warping in wiring board 100 of sample #1 is 37 μm, whereas the amount of warping in the wiring board of sample #2 is 58 μm.

FIG. 3B is a view schematically showing how warping occurs in wiring board 100. As shown in FIG. 2B, resin layer (400d) is formed on the upper surface of substrate (400c) of electronic component 400. On the upper surface of substrate (400c) of electronic component 400, second interlayer resin insulation layer 420 is further formed. Therefore, the resin in resin layer (400d) and the resin in second interlayer resin insulation layer 420 are present on the upper surface of substrate (400c) of electronic component 400. By contrast, only the resin in first interlayer resin insulation layer 410 is present on the lower surface of substrate (400e) of electronic component 400.

If thickness (t1) of first interlayer resin insulation layer 410 is substantially the same as thickness (t2) of second interlayer resin insulation layer 420, the amount of resin in each interlayer resin insulation layer is the same. As a result, the amount of resin existing on the upper surface of substrate (400c) of electronic component 400 built into core substrate 300 is greater than the amount of resin existing on the lower surface of substrate (400c) of electronic component 400 by the amount of resin in resin layer (400d) of the electronic component.

Under the above circumstances, if curing contraction occurs in resin, the contraction amount is different on the upper side of substrate (400c) of electronic component 400 from the lower side of substrate (400c) of electronic component 400, as shown in FIG. 3B. In particular, compared with the contraction amount of the resin on the lower surface of substrate (400c) of electronic component 400, the contraction amount of the resin on the upper surface of substrate (400c) of electronic component 400 is greater. Warping occurs in wiring board 100 due to the difference between the contraction amount generated on the upper side of substrate (400c) of electronic component 400 and the contraction amount generated on the lower side of substrate (400c) of electronic component 400.

Therefore, if the amount of resin existing on the upper surface of substrate (400c) of electronic component 400 is made substantially the same as the amount of resin existing on the lower surface of substrate (400c) of electronic component 400, then the contraction amount of resin existing on the upper surface of substrate (400c) of electronic component 400 becomes substantially the same as the contraction amount of resin existing on the lower surface of substrate (400c) of electronic component 400. As a result, warping is suppressed from occurring in wiring board 100. For the above reasons, first interlayer resin insulation layer 410 and second interlayer resin insulation layer 420 are formed in such a way that thickness (t1) of first interlayer resin insulation layer 410 formed on the lower surface of substrate (400c) of electronic component 400 is greater than thickness (t2) of second interlayer resin insulation layer 420 formed on the upper surface of substrate (400c) of electronic component 400. Accordingly, the amount of resin existing on the side above substrate (400c) of electronic component 400 and the amount of resin existing on the side below substrate (400c) of electronic component 400 are adjusted.

In the first embodiment, thickness (t1) of first interlayer resin insulation layer 410 is set greater than thickness (t2) of second interlayer resin insulation layer 420. Therefore, the amount of resin in first interlayer resin insulation layer 410 is greater than the amount of resin in second interlayer resin insulation layer 420. In addition, electronic component 400 has resin layer (400d) on the upper surface of substrate (400c), but does not have resin layer (400d) on the lower surface. First interlayer resin insulation layer 410 is present on the lower surface of substrate (400c) of electronic component 400, whereas second interlayer resin insulation layer 420, which is thinner than first interlayer resin insulation layer 410, and resin layer (400d) are present on the upper surface of substrate (400c) of electronic component 400. As a result, the sum of the amount of resin in resin layer (400d) formed on the upper surface of substrate (400c) of electronic component 400 and the amount of resin in second interlayer resin insulation layer 420 formed on the upper surface of substrate (400c) of electronic component 400 is substantially the same as the amount of resin in first interlayer resin insulation layer 410 formed on the lower surface of substrate (400c) of electronic component 400. Accordingly, even if curing contraction occurs in resin, the amount of curing contraction in the resin formed on the upper surface of substrate (400c) of electronic component 400 is substantially the same as the amount of curing contraction in the resin formed on the lower surface of substrate (400c) of electronic component 400. Therefore, suppressing warping in wiring board 100 is achieved. Wiring board 100 according to the first embodiment is effective when the percentage of core substrate 300 occupied by electronic component 400 is high.

In the following, a method for manufacturing wiring board 100 of the first embodiment is described.

Figure 4A:
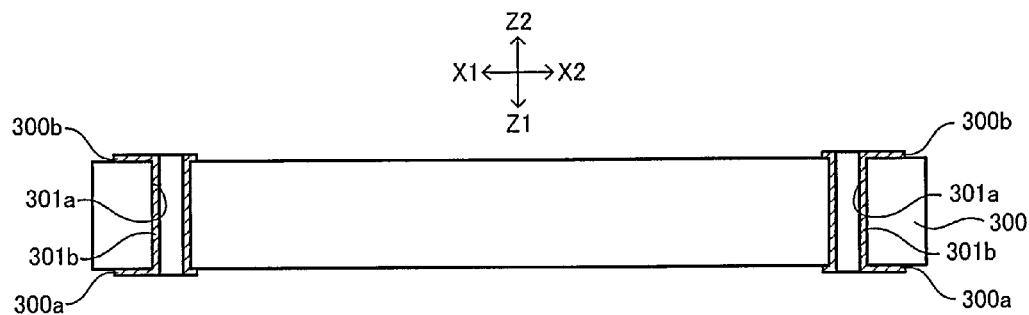
FIGS. 4A-4D are views showing the flow of steps in the first embodiment.

First, FIG. 4A shows core substrate 300 where through holes (301a), through-hole conductors (301b) and wiring layers (300a, 300b) are formed. Core substrate 300 corresponds to the core of wiring board 100.

Figure 4B:
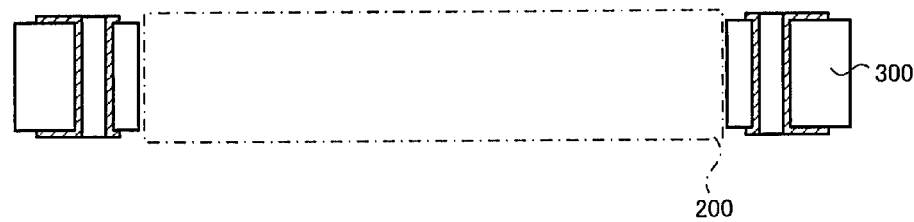

Next, as shown in FIG. 4B, space 200 which penetrates core substrate 300 is formed in core substrate 300 by using a laser or the like.

Figure 4C:

Next, as shown in FIG. 4C, carrier 2110 made of PET (polyethylene terephthalate), for example, is laminated on the first-surface side of core substrate 300. Carrier 2110 is adhered to core substrate 300 by lamination, for example.

Figure 4D:
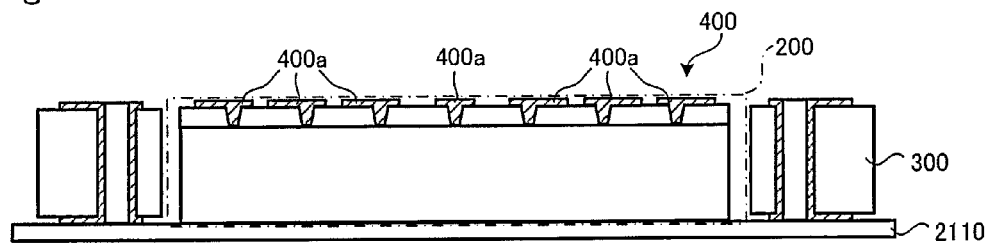

Next, as shown in FIG. 4D, electronic component 400 is accommodated in space 200 (accommodation section) so that electrodes (400a) of electronic component 400 face upward (opposite side of carrier 2110), and then is fixed onto carrier 2110. The surfaces of electrodes (400a) may be roughened. The roughened surfaces of electrodes (400a) are usually formed by roughening the electrode surfaces using a chemical agent or the like.

Figure 5A:
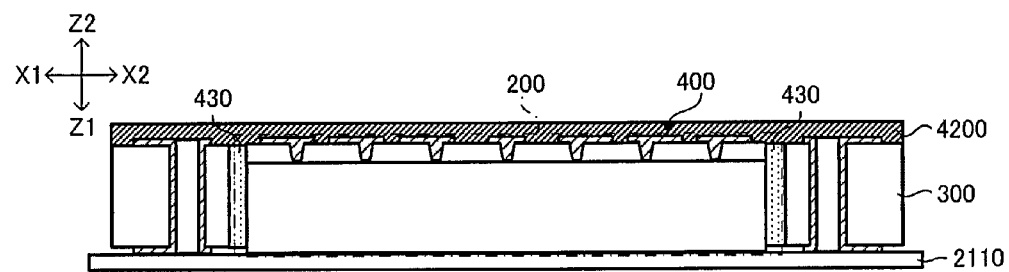
FIGS. 5A-5B are views showing the flow of steps in the first embodiment.

Next, as shown in FIG. 5A, film-type insulation layer 4200 for second interlayer resin insulation layer 420 is laminated on electronic component 400 and core substrate 300 by vacuum lamination, for example. Then, insulation layer 4200 is cured through thermal pressing, and second interlayer resin insulation layer 420 is formed on core substrate 300 and on electronic component 400. Simultaneously, the resin in insulation layer 4200 seeps into the gap between electronic component 400 and core substrate 300, filling the gap between electronic component 400 and core substrate 300. The resin filling the gap between electronic component 400 and core substrate 300 is cured to become resin filler 430. The gap between electronic component 400 and core substrate 300 is filled with resin filler 430. Accordingly, electronic component 400 is fixed to a predetermined position. As for film-type insulation layer 4200 for second interlayer resin insulation layer 420, an insulation layer made of resin such as epoxy resin and inorganic particles such as silica, an insulation layer made of resin such as epoxy resin, inorganic particles such as silica and reinforcing material such as glass cloth, and the like may be listed. If film-type insulation layer 4200 for second interlayer resin insulation layer 420 contains inorganic particles such as silica, resin filler 430 is made of resin and inorganic particles.

Figure 5B:
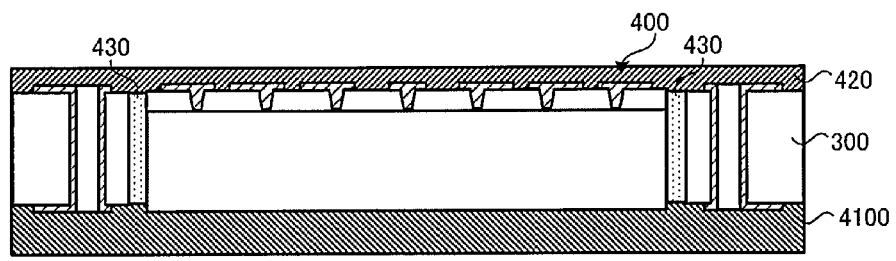

Next, carrier 2110 is removed from the first surface of core substrate 300 (the surface opposite second interlayer resin insulation layer 420). Then, as shown in FIG. 5B, film-type insulation layer 4100 for first interlayer resin insulation layer 410 is laminated on the first surface of core substrate 300. Film-type insulation layer 4100 for first interlayer resin insulation layer 410 is the same as film-type insulation layer 4200 for second interlayer resin insulation layer 420. The film thickness of film-type insulation layer 4100 for first interlayer resin insulation layer 410 is greater than the film thickness of film-type insulation layer 4200 for second interlayer resin insulation layer 420. Then, insulation layer 4100 for first interlayer resin insulation layer 410 is cured through thermal pressing, and first interlayer resin insulation layer 410 is formed on core substrate 300 and on electronic component 400. Accordingly, electronic component 400 is built into core substrate 300.

The film thickness of first interlayer resin insulation layer 410 is (t1), and the film thickness of second interlayer resin insulation layer 420 is (t2). As described above, since the film thickness of film-type insulation layer 4100 and the film thickness of film-type insulation layer 4200 are different, (t1) is greater than (t2). Here, spots to measure film thicknesses of first and second interlayer resin insulation layers (410, 420) are described in the following.

Figure 6:
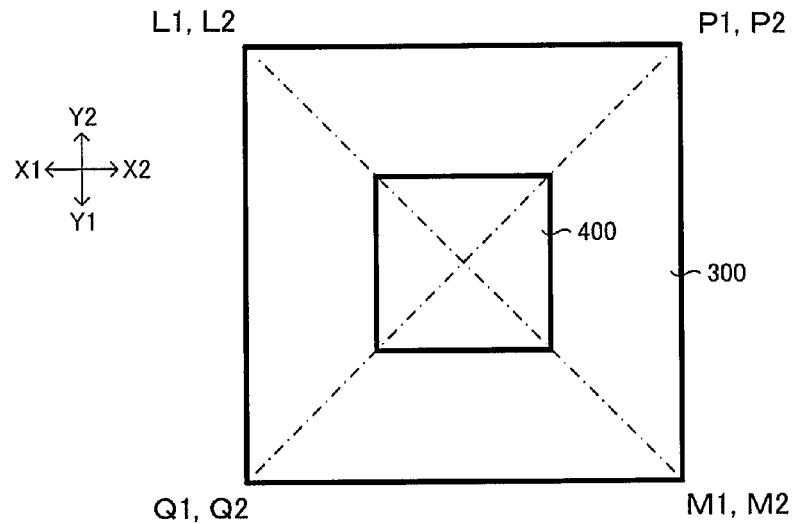
FIG. 6 is a view showing a surface of a first interlayer resin insulation layer of the unfinished substrate in the step shown in FIG. 5B.
Figure 7A:
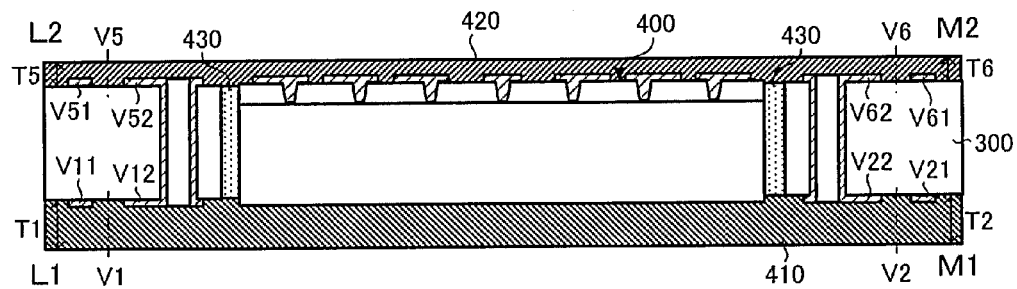
FIG. 7A is a cross-sectional view obtained by slicing the unfinished substrate in FIG. 5B along a first diagonal line with a plane perpendicular to the surface of the first interlayer resin insulation layer.
Figure 7B:
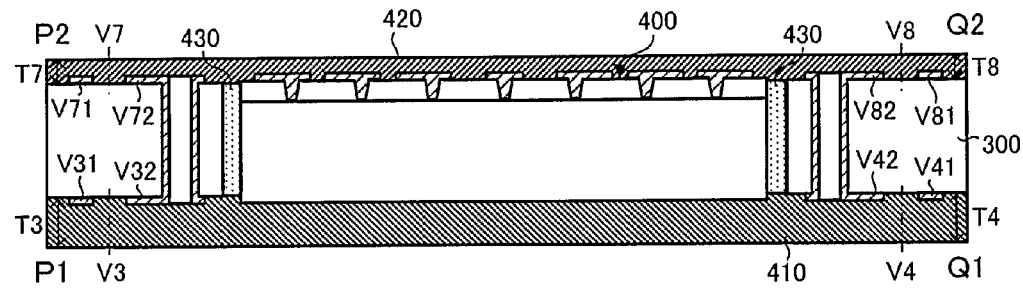
FIG. 7B is a cross-sectional view obtained by slicing the unfinished substrate in FIG. 5B along a second diagonal line with a plane perpendicular to the surface of the first interlayer resin insulation layer.

FIG. 6 shows the surface of first interlayer resin insulation layer 410 of the unfinished substrate shown in FIG. 5B. FIG. 7A is a cross-sectional view showing the section obtained by slicing the unfinished substrate in FIG. 5B with a plane which passes through (L1-M1) and is perpendicular to the surface of first interlayer resin insulation layer 410. (M1) is the opposite angle of (L1), and (M2) is the opposite angle of (L2). FIG. 7B is a cross-sectional view showing the section obtained by slicing the unfinished substrate in FIG. 5B with a plane which passes through (P1-Q1) and is perpendicular to the surface of first interlayer resin insulation layer 410. Diagonal line (P1-Q1) is different from diagonal line (L1-M1). (Q1) is the opposite angle of (P1), and (Q2) is the opposite angle of (P2).

(V1) is the intermediate point between conductive circuit (V11), which is the closest to one corner (L1) of the unfinished substrate, and next conductive circuit (V12). (V2) is the intermediate point between conductive circuit (V21), which is the closest to one corner (M1) of the unfinished substrate, and next conductive circuit (V22). (V3) is the intermediate point between conductive circuit (V31), which is the closest to one corner (P1) of the unfinished substrate, and next conductive circuit (V32). (V4) is the intermediate point between conductive circuit (V41), which is the closest to one corner (Q1) of the unfinished substrate, and next conductive circuit (V42). (V5) is the intermediate point between conductive circuit (V51), which is the closest to one corner (L2) of the unfinished substrate, and next conductive circuit (V52). (V6) is the intermediate point between conductive circuit (V61), which is the closest to one corner (M2) of the unfinished substrate, and next conductive circuit (V62). (V7) is the intermediate point between conductive circuit (V71), which is the closest to one corner (P2) of the unfinished substrate, and next conductive circuit (V72). (V8) is the intermediate point between conductive circuit (V81), which is the closest to one corner (Q2) of the unfinished substrate, and next conductive circuit (V82).

The film thickness of first interlayer resin insulation layer 410 at (V1) is distance (T1) from the first surface of core substrate 300 to the top surface of first interlayer resin insulation layer 410. The film thickness of first interlayer resin insulation layer 410 at (V2) is distance (T2) from the first surface of core substrate 300 to the top surface of first interlayer resin insulation layer 410. The film thickness of first interlayer resin insulation layer 410 at (V3) is distance (T3) from the first surface of core substrate 300 to the top surface of first interlayer resin insulation layer 410. The film thickness of first interlayer resin insulation layer 410 at (V4) is distance (T4) from the first surface of core substrate 300 to the top surface of first interlayer resin insulation layer 410. The film thickness of second interlayer resin insulation layer 420 at (V5) is distance (T5) from the second surface of core substrate 300 to the top surface of second interlayer resin insulation layer 420. The film thickness of second interlayer resin insulation layer 420 at (V6) is distance (T6) from the second surface of core substrate 300 to the top surface of second interlayer resin insulation layer 420. The film thickness of second interlayer resin insulation layer 420 at (V7) is distance (T7) from the second surface of core substrate 300 to the top surface of second interlayer resin insulation layer 420. The film thickness of second interlayer resin insulation layer 420 at (V8) is distance (T8) from the second surface of core substrate 300 to the top surface of second interlayer resin insulation layer 420.

Film thickness (t1) of first interlayer resin insulation layer 410 is the average value of film thicknesses (T1, T2, T3, T4) at four points (V1, V2, V3, V4) shown in FIGS. 7A and 7B. Film thickness (t2) of second interlayer resin insulation layer 420 is the average value of film thicknesses (T5, T6, T7, T8) at four points (V5, V6, V7, V8) shown in FIGS. 7A and 7B.

In the first embodiment, the amount of resin on the first surface of electronic component 400 having resin layer (400d) and the amount of resin on the second surface of electronic component 400 having resin layer (400d) are adjusted to reduce the amount of warping in wiring board 100. In the first embodiment, the amounts of resin are adjusted by changing the thicknesses of film-type insulation layers (4100, 4200) for first and second interlayer resin insulation layers (410, 420). In the first embodiment, part of film-type insulation layer 4200 for second interlayer resin insulation layer 420 seeps into space 200 (accommodation section). However, since the above measuring points (V1 through V8) are positioned relatively distant from the penetrating hole to accommodate electronic component 400, film thicknesses (t1, t2) of first and second interlayer resin insulation layers (410, 420) are substantially the same as the film thicknesses of film-type insulation layers (4100, 4200) for first and second interlayer resin insulation layers (410, 420). Therefore, by adjusting the film thicknesses of first and second interlayer resin insulation layers (410, 420) measured by the above measuring method, a decrease in the amount of warping in wiring board 100 is achieved. Also, since the thickness of electronic component 400 is substantially the same as the thickness of core substrate 300 in the first embodiment, the average value of (T1, T2, T3, T4) is substantially the same as the film thickness of first interlayer resin insulation layer 410 on the second surface of electronic component 400 (the lower surface of substrate (400c) of electronic component 400), and the average value of (T5, T6, T7, T8) is substantially the same as the film thickness of second interlayer resin insulation layer 420 on the first surface of electronic component 400 (the upper surface of substrate (400c) of electronic component 400).

If film-type insulation layers (4100, 4200) for first and second interlayer resin insulation layers (410, 420) are made of resin such as epoxy resin and inorganic particles such as silica, then first and second interlayer resin insulation layers (410, 420) are made of resin such as epoxy resin and inorganic particles such as silica. Also, if film-type insulation layers (4100, 4200) for first and second interlayer resin insulation layers (410, 420) are made of resin such as epoxy resin, inorganic particles such as silica and reinforcing material such as glass cloth, then first and second interlayer resin insulation layers (410, 420) are made of resin such as epoxy resin, inorganic particles such as silica and reinforcing material such as glass cloth.

Figure 8A:
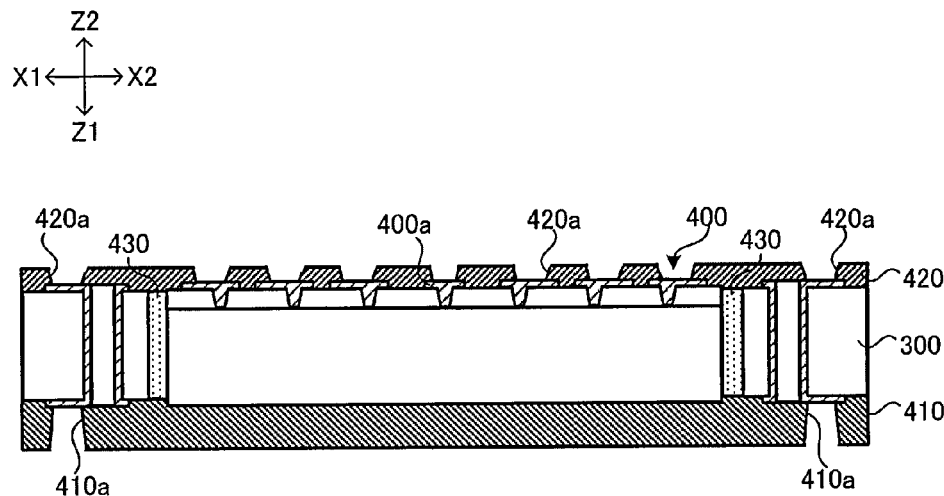
FIGS. 8A-8B are views showing the flow of steps in the first embodiment.

Next, as shown in FIG. 8A, via holes (410a, 420a) are formed in first and second interlayer resin insulation layers (410, 420) using a laser or the like.

Figure 8B:
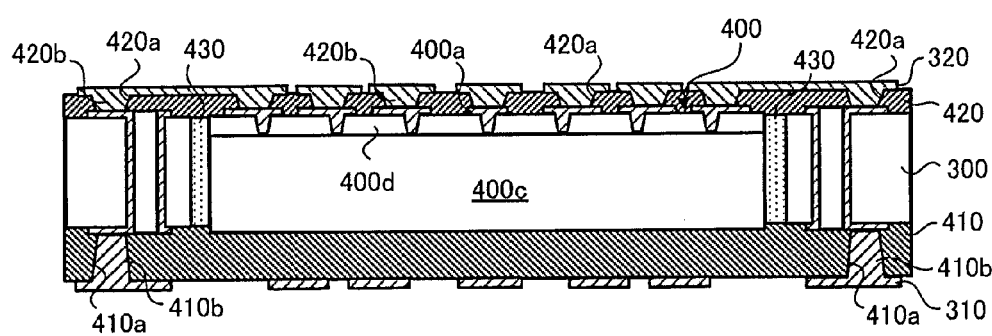

Next, as shown in FIG. 8B, wiring layers (310, 320) containing conductive circuits are formed on first and second interlayer resin insulation layers (410, 420) by a semi-additive method, for example. In addition, via holes (410a, 420a) are filled with conductor to form filled vias (first and second via conductors (410b, 420b)) in via holes (410a, 420a). First via conductors (410b) connect conductive circuits (wiring layer 300a) on core substrate 300 and conductive circuits (wiring layer 310) on first interlayer resin insulation layer 410. Second via conductors (420b) connect electrodes (400a) of electronic component 400 and conductive circuits (wiring layer 320) on second interlayer resin insulation layer 420, and also connect conductive circuits (wiring layer 300b) on core substrate 300 and conductive circuits (wiring layer 320) on second interlayer resin insulation layer 420. Instead of a semi-additive method, wiring layers (310, 320) may be formed by a subtractive method.

Accordingly, wiring board 100 as shown in FIG. 1A is completed.

In a step of the first embodiment, first and second interlayer resin insulation layers (410, 420) are formed so that thickness (t1) of first interlayer resin insulation layer 410 formed on the lower surface of substrate (400c) of electronic component 400 is greater than thickness (t2) of second interlayer resin insulation layer 420 formed on the upper surface of substrate (400c) of electronic component 400. Accordingly, the amount of resin in first interlayer resin insulation layer 410 is greater than the amount of resin in second interlayer resin insulation layer 420. As a result, the sum of the amount of resin in resin layer (400d) on substrate (400c) of electronic component 400 and the amount of resin in second interlayer resin insulation layer 420 is substantially the same as the amount of resin in first interlayer resin insulation layer 410. Therefore, even if curing contraction occurs in resin, since the amount of curing contraction is substantially the same on the upper and lower sides of substrate (400c) of electronic component 400, suppressing warping in wiring board 100 is achieved.

Figure 9:
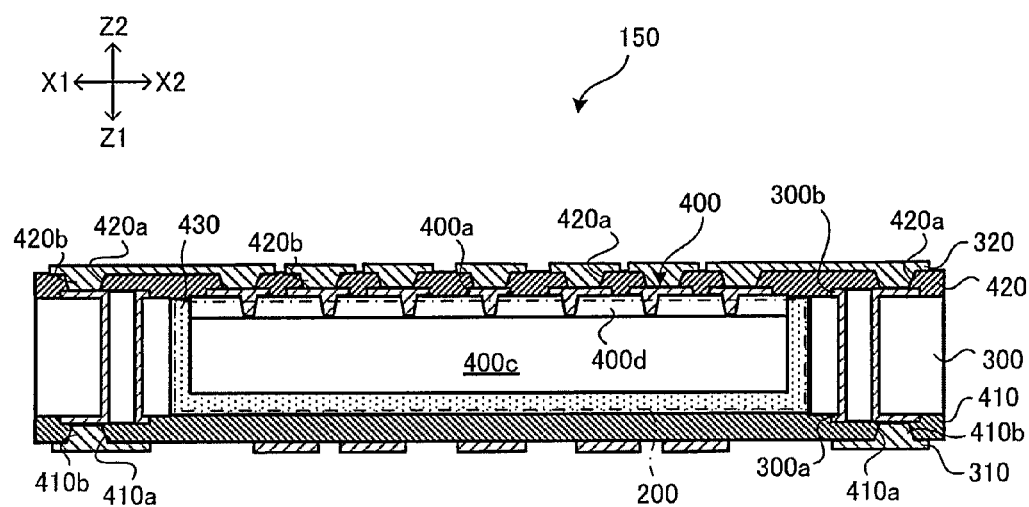
FIG. 9 is a cross-sectional view of a wiring board according to the second embodiment of the present invention.

FIG. 9 shows wiring board 150 according to the second embodiment of the present invention. In the following descriptions, the same reference number is used for the same portion as that of wiring board 100 in the first embodiment shown in FIG. 1A.

Substrate (400c) of electronic component 400 in the second embodiment is thinner than substrate (400c) of electronic component 400 in the first embodiment. Electronic component 400 in the second embodiment is thinner than electronic component 400 in the first embodiment. In the second embodiment, the thickness of electronic component 400 is less than the thickness of core substrate 300. In the second embodiment, since substrate (400c) of electronic component 400 is thinner, not only wiring board 150 (printed wiring board), but also electronic component 400 tends to warp. In the second embodiment, top surfaces of conductive circuits (second conductive circuits) formed on the second surface of core substrate 300 are preferred to be positioned on substantially the same plane as the first surface of electronic component 400.

Figure 10A:
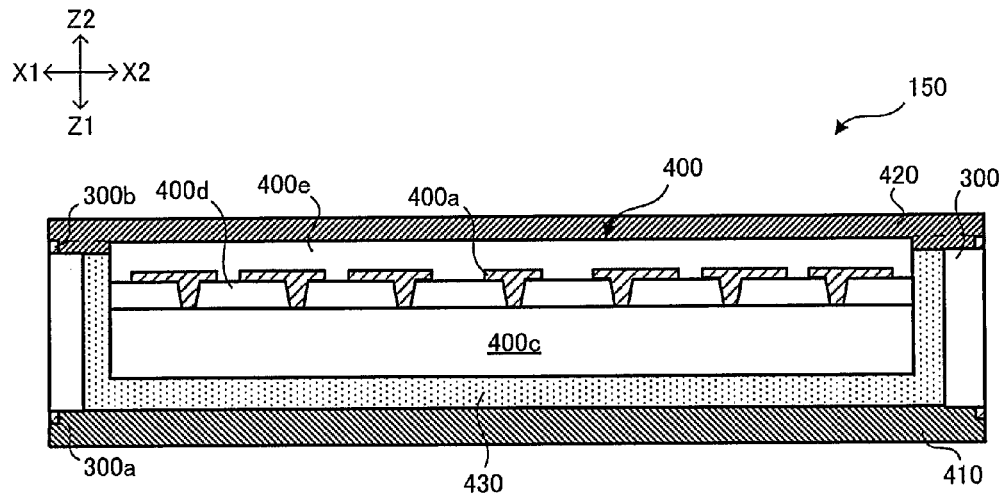
FIGS. 10A-10B are a cross-sectional view of a wiring board according to the second embodiment.
Figure 10B:
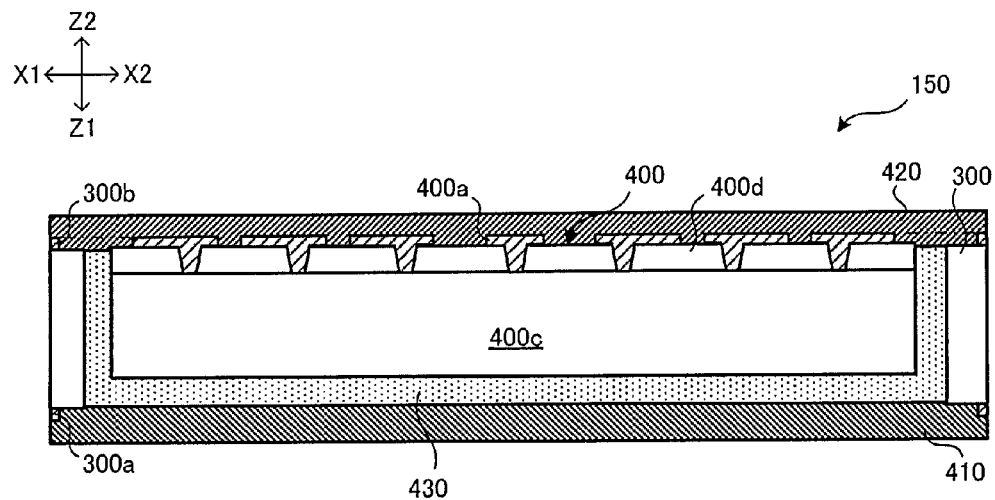

FIG. 10A shows an example in which electronic component 400 has protective film (400e). In the example shown in FIG. 10A, the top surface of protective film (400e) of electronic component 400 is positioned on substantially the same plane as the top surfaces of second conductive circuits (wiring layer 300b). FIG. 10B shows an example in which electronic component 400 does not have protective film (400e). In the example shown in FIG. 10B, top surfaces of electrodes (400a) of electronic component 400 are positioned on substantially the same plane as the top surfaces of second conductive circuits (wiring layer 300b). Since resin filler 430 is present on the second surface of electronic component 400 in space 200, electronic component 400 seldom warps. In the first embodiment, electronic component 400 with protective film (400e) or electronic component 400 without protective film (400e) may be used. By forming via holes in protective film (400e), electrodes (400a) of electronic component 400 are partially exposed.

As shown in FIG. 9, wiring board 150 has core substrate 300, wiring layers (310, 320) as conductive patterns and electronic component 400. Core substrate 300 has space 200 (accommodation section) which corresponds to the external shape of electronic component 400. Electronic component 400 is accommodated in space 200. In the second embodiment, electronic component 400 the same as that in the first embodiment may be used.

Core substrate 300 is made of epoxy resin, for example. Core substrate 300 is preferred to be made of resin such as epoxy resin and reinforcing material such as glass fiber or aramid fiber. Reinforcing material has a smaller thermal expansion coefficient than the primary material (epoxy resin). The thickness of core substrate 300 (in arrows Z1-Z2 direction) is 0.1 mm, for example, and its length (in arrows X1-X2 direction) is 11 mm, for example. The length of electronic component 400 (in arrows X1-X2 direction) is 8 mm, for example, and its thickness is 0.08 mm.

Through holes (301a) are formed in core substrate 300. Through-hole conductors (301b) are formed on the inner walls of through holes (301a). Wiring layers (300a, 300b) are formed on their respective surfaces (both surfaces) of core substrate 300. Wiring layer (300a) and wiring layer (300b) are electrically connected by through hole (301b). The thickness of wiring layers (300a, 300b) in the second embodiment is set in the same range as that in the first embodiment. The thickness of wiring layers (300a, 300b) of wiring board 150 shown in FIG. 9 is 25 μm.

First interlayer resin insulation layer 410 and wiring layer 310 are laminated in that order on the first surface (Z1-side surface) of core substrate 300. Also, second interlayer resin insulation layer 420 and wiring layer 320 are laminated in that order on the second surface (Z2-side surface) of core substrate 300. First and second interlayer resin insulation layers (410, 420) are made of resin such as epoxy resin and glass cloth, for example. In addition, the interlayer resin insulation layers may contain inorganic particles such as $SiO_2$ or $Al_2O_3$. The interlayer resin insulation layers may be made of resin such as epoxy resin and inorganic particles such as $SiO_2$ or $Al_2O_3$. Also, wiring layers (310, 320) are made of copper-plated film, for example.

Electronic component 400 is positioned in space 200. The gap between electronic component 400 and core substrate 300 is filled with resin filler 430. Resin filler 430 is preferred to be made of resin such as epoxy resin and inorganic particles. Resin filler 430 may also be made of resin and inorganic particles that have seeped into the gap from the interlayer resin insulation layer.

First interlayer resin insulation layer 410 is formed on the lower surface of substrate (400c) of electronic component 400, on the first surface of core substrate 300 and on the wiring layer (300a) formed on the first surface of core substrate 300. Via holes (410a) reaching wiring layer (300a) are formed in predetermined spots of first interlayer resin insulation layer 410. Via holes (410a) are filled with plated film such as copper-plated film. Wiring layer (300a) and wiring layer 310 are electrically connected by first via conductors (410b) filled in via holes.

On the other hand, second interlayer resin insulation layer 420 covers the first surface of electronic component 400, the second surface of core substrate 300 and the conductive circuits on the second surface of core substrate 300. Via holes (420a) reaching wiring layer (300b) or electrodes (400a) are formed in predetermined spots of second interlayer resin insulation layer 420. Via holes (420a) are filled with plated film such as copper-plated film. Wiring layer (300b) and electrodes (400a) are electrically connected to wiring layer 320 by second via conductors (420b) filled in via holes (420a). Wiring layer 320 and second via conductors (420b) are made of copper-plated film, for example.

Electronic component 400 is surrounded by first and second interlayer resin insulation layers (410, 420) and resin filler 430. Accordingly, electronic component 400 is protected by first and second interlayer resin insulation layers (410, 420), and is fixed to a predetermined position.

In the second embodiment, by making substrate (400c) of electronic component 400 thinner, the second surface of electronic component 400 is positioned to the Z2 side from the first surface of core substrate 300. The second surface of electronic component 400 (the lower surface of substrate 400c) is recessed from the first surface of core substrate 300. The first surface of electronic component 400 is positioned on substantially the same plane as the top surfaces of conductive circuits (wiring layer 300b) on the second surface of core substrate 300, and the second surface of electronic component 400 (the lower surface of substrate (400c) of electronic component 400) is positioned in space 200.

In space 200, resin layer (400d) of electronic component 400 is formed on the upper surface of substrate (400c) of electronic component 400, and resin filler 430 is formed on the lower surface of substrate (400c) of electronic component 400. Accordingly, since resin is present on the upper and lower surfaces of substrate (400c) of electronic component 400 in space 200, the amount of warping in electronic component 400 is zero or minimum. In the second embodiment, the same as in the first embodiment, the film thickness of film-type insulation layer 4200 for second interlayer resin insulation layer 420 is less than the film thickness of film-type insulation layer 4100 for first interlayer resin insulation layer 410. Therefore, the amount of resin in film-type insulation layer 4100 for first interlayer resin insulation layer 410 is greater than the amount of resin in film-type insulation layer 4200 for second interlayer resin insulation layer 420. As a result, the sum of the amount of resin in resin layer (400d) on the upper surface of substrate (400c) of electronic component 400 and the amount of resin in second interlayer resin insulation layer 420 is substantially the same as the amount of resin in first interlayer resin insulation layer 410 formed on the lower surface of substrate (400c) of electronic component 400 and on the first surface of core substrate 300. Accordingly, even if curing contraction occurs in resin, since the amount of curing contraction is substantially the same on the upper and lower surfaces of substrate (400c) of electronic component 400, suppressing warping in wiring board 150 is achieved.

Figure 11A:
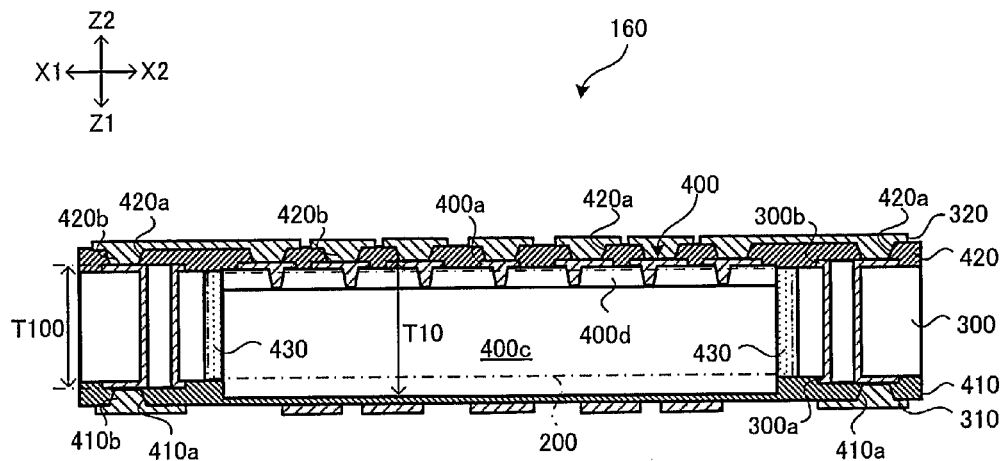
FIGS. 11A-11B are views showing alternative structural examples of wiring boards in which the amount of resin on the upper-surface side of the substrate of an electronic component is different from that on the lower-surface side.
Figure 11B:
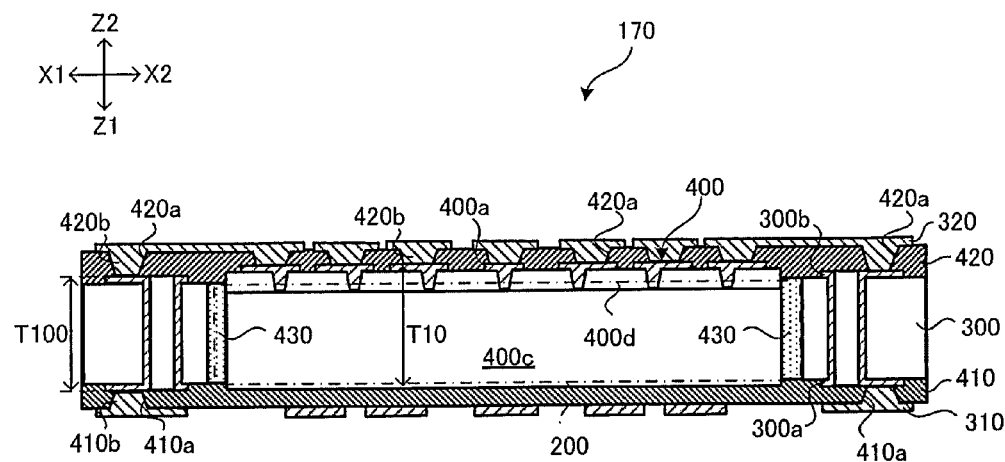

The structure of a wiring board which allows adjustment in the amounts of resin on the upper-surface side and the lower-surface side of substrate (400c) of electronic component 400 is not limited to those described in the first and second embodiments. For example, as in wiring boards (160, 170) shown in FIGS. 11A and 11B, thickness (T10) of electronic component 400 may be greater than (T100). FIG. 11A shows an example in which the first surface of electronic component 400 is positioned on substantially the same plane as the top surfaces of conductive circuits (wiring layer 300b) on the second surface of core substrate 300. FIG. 11B shows an example in which the second surface of electronic component 400 is positioned on substantially the same plane as the top surfaces of conductive circuits (wiring layer 300a) on the first surface of core substrate 300.

In wiring board 160 shown in FIG. 11A, the second surface of electronic component 400 is positioned beyond the top surfaces of first conductive circuits (wiring layer 300a) (the surfaces opposite the surfaces which are in contact with the first surface of core substrate 300) outside core substrate 300 (toward the Z1 side). Accordingly, the distance from the lower surface of substrate (400c) of electronic component 400 to the top surface of first interlayer resin insulation layer 410 is reduced. If electronic component 400 is an IC, wiring board 160 in FIG. 11A is excellent in heat dissipation compared with wiring board 100 of the first embodiment, wiring board 150 of the second embodiment and wiring board 170 shown in FIG. 11B.

In wiring board 170 shown in FIG. 11B, the first surface of electronic component 400 is positioned beyond the top surfaces of second conductive circuits (wiring layer 300b) (the surfaces opposite the surfaces which are in contact with the second surface of core substrate 300) outside the substrate (toward the Z2 side). Accordingly, the distance from the top surface of second interlayer resin insulation layer 420 to electrodes (400a) of electronic component 400 is shorter than those in wiring board 100 of the first embodiment, wiring board 150 of the second embodiment and wiring board 160 in FIG. 11A. Therefore, since the diameter of via holes (420a) on electrodes (400a) of electronic component 400 may be set greater in wiring board 170 shown in FIG. 11B, connection reliability is enhanced between electrodes (400a) of electronic component 400 and via conductors (420b) connected to electrodes (400a), compared with wiring board 100 of the first embodiment, wiring board 150 of the second embodiment and wiring board 160 in FIG. 11A.

Figure 13A:
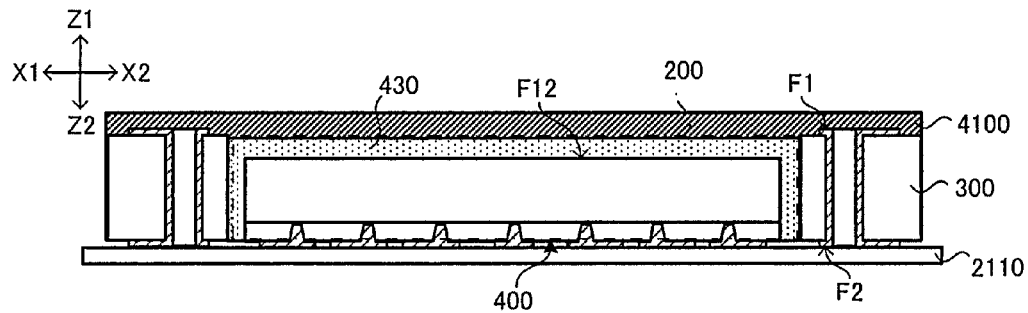
FIGS. 13A-13D are views showing the flow of steps in the second embodiment.
Figure 13B:
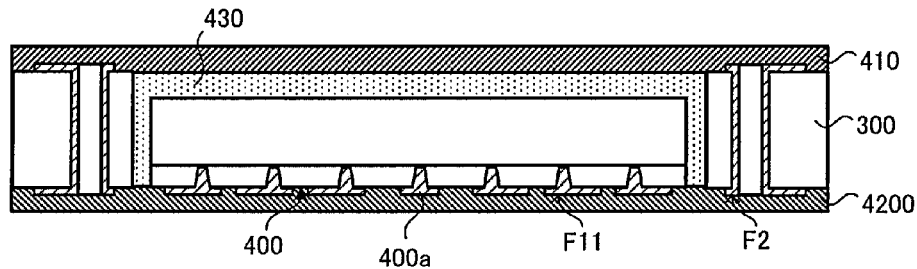

The thickness of film-type insulation layer 4100 for first interlayer resin insulation layer 410 (see FIG. 13A) used for manufacturing wiring boards (160, 170) shown in FIGS. 11A and 11B is greater than the thickness of film-type insulation layer 4200 for second interlayer resin insulation layer 420 (see FIG. 13B). Accordingly, the amount of warping in wiring boards is reduced. The position and method for measuring the thicknesses of first and second interlayer resin insulation layers (410, 420) in wiring boards (160, 170) shown in FIGS. 11A and 11B are the same as in the first embodiment. The thicknesses of wiring layers (300a, 300b), core substrate 300, electronic component 400 and interlayer resin insulation layers are the same size and made of the same materials as those in the first embodiment.

In the following, a method for manufacturing wiring board 150 according to the second embodiment is described with reference to FIGS. 12A-13D.

Figure 12A:
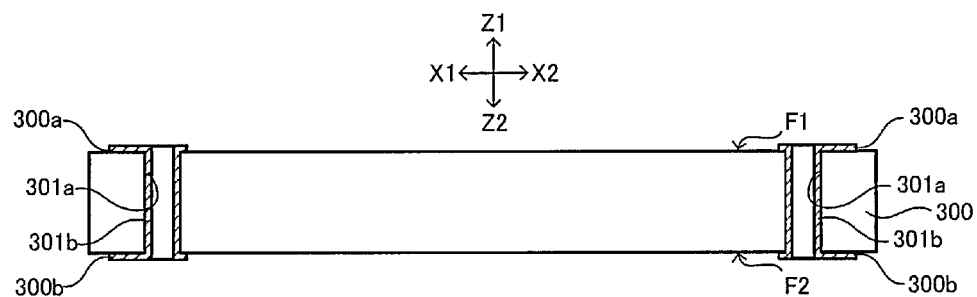
FIGS. 12A-12D are views showing the flow of steps in the second embodiment.
Figure 12B:
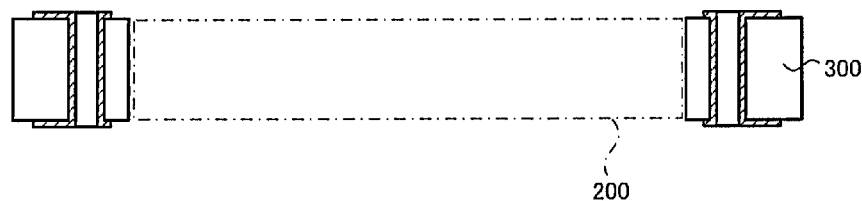

As shown in FIG. 12A, through holes (301a) are formed in core substrate 300 having first surface (F1) and second surface (F2) opposite first surface (F1). Through-hole conductors (301b) are formed on the inner walls of through holes (301a), connecting first conductive circuits (wiring layer 300a) on first surface (F1) of core substrate 300 and second conductive circuits (wiring layer 300b) on second surface (F2) of core substrate 300. Next, as shown in FIG. 12B, space 200 is formed in core substrate 300 using a laser or the like.

Figure 12C:
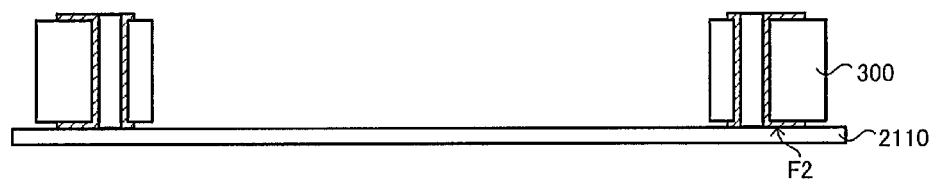

Next, as shown in FIG. 12C, carrier 2110 made of PET (polyethylene terephthalate), for example, is laminated on the second surface (F2) of core substrate 300. Carrier 2110 is adhered to core substrate 300 by lamination, for example.

Figure 12D:
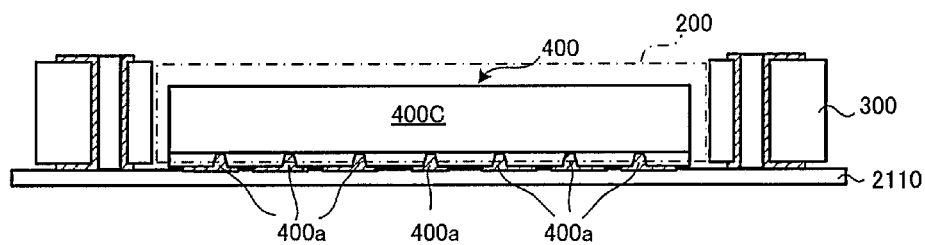

Next, as shown in FIG. 12D, electronic component 400 is fixed onto carrier 2110 in space 200 so that electrodes (400a) of electronic component 400 face carrier 2110. The surfaces of electrodes (400a) may be roughened. In the first embodiment, the side where substrate (400c) is present is fixed onto carrier 2110, but the side where electrodes (400a) are formed is fixed onto carrier 2110 in the second embodiment.

Next, as shown in FIG. 13A, film-type insulation layer 4100 for first interlayer resin insulation layer 410 is laminated on second surface (F12) of electronic component 400 and on first surface (F1) of core substrate 300 by vacuum lamination, for example. Insulation layer 4100 is softened through thermal pressing, and resin in insulation layer 4100 seeps into the opening in space 200 (accommodation section). After that, the resin in insulation layer 4100 is cured, and the opening in space 200 except for electronic component 400 is filled with resin filler 430. Also, first interlayer resin insulation layer 410 is formed on first surface (F1) of core substrate 300, on wiring layer (300a) and on the lower surface of substrate (400c) of electronic component 400. Accordingly, electronic component 400 is fixed to a predetermined position. The same material as in the first embodiment is used for film-type insulation layer 4100 for first interlayer resin insulation layer 410.

Next, carrier 2110 is removed from second surface (F2) of core substrate 300 (the surface opposite first interlayer resin insulation layer 410). Then, as shown in FIG. 13B, film-type insulation layer 4200 for second interlayer resin insulation layer 420 is laminated on second surface (F2) of core substrate 300 and on first surface (F11) of electronic component 400. The thickness of film-type insulation layer 4200 for second interlayer resin insulation layer 420 is less than the thickness of film-type insulation layer 4100 for first interlayer resin insulation layer 410. Then, insulation layer 4200 is cured through thermal pressing, and second interlayer resin insulation layer 420 is formed on second surface (F2) of core substrate 300 and on first surface (F11) of electronic component 400. Accordingly, first surface (F11) of electronic component 400 is covered with second interlayer resin insulation layer 420. Then, electronic component 400 is built into core substrate 300.

Figure 13C:
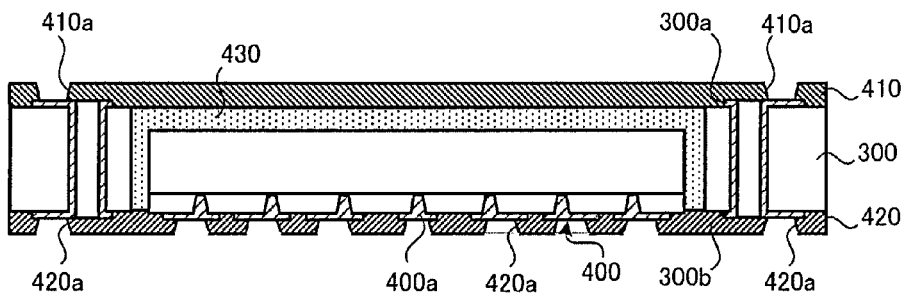

Next, as shown in FIG. 13C, using a laser or the like, via holes (410a, 420a) are formed in first and second interlayer resin insulation layers (410, 420) to reach electrodes (400a) of electronic component 400 or first conductive circuits (wiring layer 300a) or second conductive circuits (wiring layer 300b) on core substrate 300.

Figure 13D:
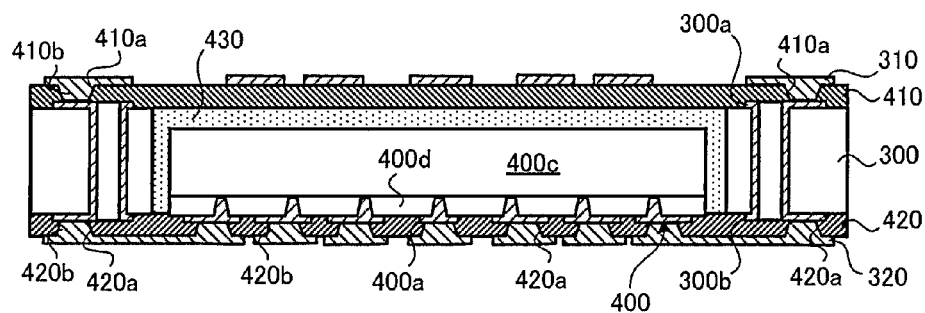

Next, as shown in FIG. 13D, using a semi-additive method, for example, wiring layers (310, 320) as well as first and second via conductors (410b, 420b) are formed. In particular, a seed layer made with electroless plated film or sputtered film is formed on first and second interlayer resin insulation layers (410, 420). Next, plating resist exposing portions of the seed layers is formed on the seed layers. Then, electrolytic plated film is formed on seed layers exposed from the plating resist. After that, the plating resist is removed, and the seed layers exposed from the electrolytic plated film are removed. Instead of a semi-additive method, wiring layers (310, 320) may be formed by a subtractive method.

Conductive patterns, namely wiring layers (310, 320), are formed on first and second interlayer resin insulation layers (410, 420) by the above semi-additive method. Simultaneously, conductor is filled in via holes (410a, 420a) to form first and second via conductors (410b, 420b) in via holes (410a, 420a). First via conductors (410b) connect conductive circuits (wiring layer 310) on first interlayer resin insulation layer 410 and conductive circuits (wiring layer 300a) on core substrate 300. Second via conductors (420b) connect conductive circuits (wiring layer 320) on second interlayer resin insulation layer 420 and conductive circuits (wiring layer 300b) on core substrate 300, and also connect electrodes (400a) of electronic component 400 and conductive circuits (wiring layer 320) on second interlayer resin insulation layer 420. As a result, wiring board 150 shown in FIG. 9 is completed.

Since substrate (400c) is thinner in the second embodiment, the lower surface of substrate (400c) of electronic component 400 is positioned inside space 200 (accommodation section) in core substrate 300. The lower surface of substrate (400c) of electronic component 400 is positioned inside core substrate 300 from the first surface of core substrate 300. In the second embodiment, the amount of resin in film-type insulation layer 4100 for first interlayer resin insulation layer 410 is greater than the amount of resin in film-type insulation layer 4200 for second interlayer resin insulation layer 420. Moreover, resin filler 430 is formed inside space 200 on the lower surface of substrate (400c) of electronic component 400. In the second embodiment, the first surface of electronic component 400 is covered with second interlayer resin insulation layer 420, whereas the second surface is covered with resin filler 430. As a result, the sum of the amount of resin in resin layer (400d) on substrate (400c) of electronic component 400 and the amount of resin in second interlayer resin insulation layer 420 formed on the upper surface of substrate (400c) of electronic component 400 and on the second surface of core substrate 300 is substantially the same as the amount of resin in resin filler 430 on the lower surface of substrate (400c) of electronic component 400 and in first interlayer resin insulation layer 410 formed on the lower surface of substrate (400c) of electronic component 400 and on the first surface of core substrate 300. Therefore, even if curing contraction occurs in resin, since the amount of curing contraction is substantially the same on the upper and lower surfaces of substrate (400c) of electronic component 400, suppressing warping in wiring board 150 is achieved. First interlayer resin insulation layer 410 described in the embodiments of the present invention covers the first surface of core substrate 300 and the top surfaces of first conductive circuits (wiring layer 300a). Also, second interlayer resin insulation layer 420 described in the embodiments of the present invention covers the second surface of core substrate 300 and the top surfaces of second conductive circuits (wiring layer 300b).

The present invention is not limited to the above embodiments. For example, the present invention may be carried out by modifying as follows.

In the above embodiments, the material, size, number of layers and so forth of each layer may be modified freely. By further continuing lamination on the structure in wiring board 100 shown in FIG. 1A and the structure of wiring board 150 shown in FIG. 9, even further multilayered wiring boards may be obtained. The amount of resin contained in each interlayer resin insulation layer to be laminated on first and second interlayer resin insulation layers (410, 420) is substantially the same. The film thickness of each interlayer resin insulation layer to be laminated on first and second interlayer resin insulation layers (410, 420) is substantially the same.

Figure 14:
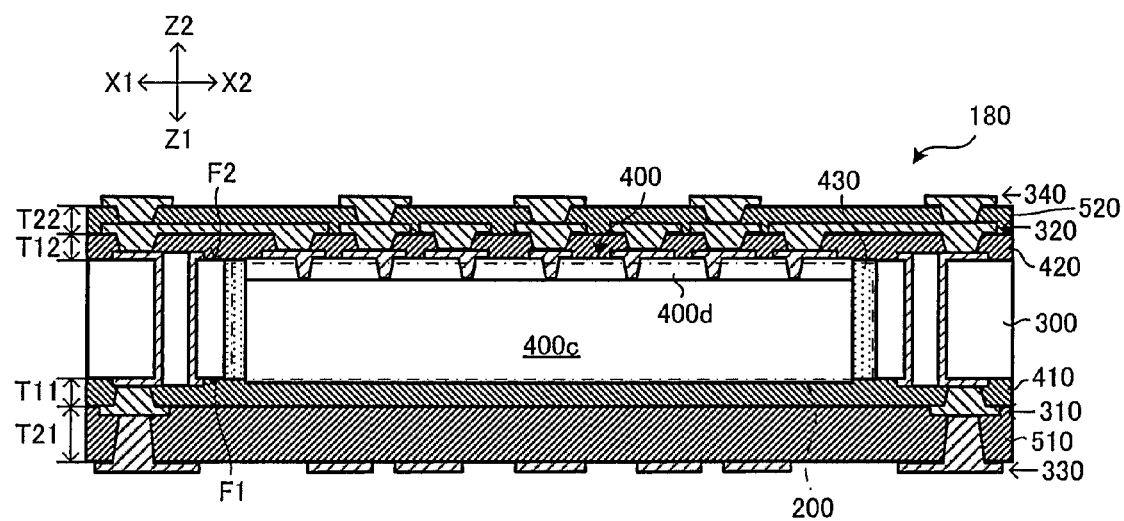
FIG. 14 is a cross-sectional view of a wiring board according to a modified example.

If multiple interlayer resin insulation layers and wiring layers are alternately laminated on the first surface of the core substrate, and multiple interlayer resin insulation layers and wiring layers are alternately laminated on the second surface of the core substrate, the sum of the thickness of each interlayer resin insulation layer formed on the first surface of the core substrate may be greater than the sum of the thickness of each interlayer resin insulation layer formed on the second surface of the core substrate. For example, as in wiring board 180 shown in FIG. 14, when two interlayer resin insulation layers (first interlayer resin insulation layer 410 and interlayer resin insulation layer 510 formed on its top) and wiring layers (310, 330) are alternately laminated on first surface (F1) of core substrate 300, and two interlayer resin insulation layers (second interlayer resin insulation layer 420 and interlayer resin insulation layer 520 formed on its top) and wiring layers (320, 340) are alternately laminated on second surface (F2) of core substrate 300, thickness (T11) of first interlayer resin insulation layer 410, which is in contact with first surface (F1) of core substrate 300, may be substantially the same as thickness (T12) of second interlayer resin insulation layer 420, which is in contact with second surface (F2) of core substrate 300, whereas thickness (T21) of interlayer resin insulation layer 510 on first interlayer resin insulation layer 410 is greater than thickness (T22) of interlayer resin insulation layer 520 on second interlayer resin insulation layer 420.

The material for each wiring layer is not limited to the above, and may be modified according to usage requirements or the like. For example, metal other than copper may be used as the material for wiring layers. Also, the material for each insulation layer is not limited to a specific type. As for resins to form insulation layers, thermosetting resins, resins containing thermosetting resin and thermoplastic resin, or photocuring resins are preferred. As for thermosetting resins, for example, other than epoxy resin, imide resin (polyimide), BT resin, allyl polyphenylene ether resin (A-PPE resin), aramid resin or the like may be used. Also, as for thermoplastic resins, for example, liquid-crystal polymer (LCP), PEEK resin, PTFE resin (fluoro resin) or the like may be used. Such materials are preferred to be selected according to requirements from the viewpoint of insulation, dielectric properties, heat resistance, mechanical features and so forth. In addition, the above resins may contain additives such as a curing agent, a stabilizer, filler or the like. Alternatively, each wiring layer and each insulation layer may be formed with multiple layers made of different materials.

The order of steps in the above embodiments may be modified freely within a scope that does not deviate from the gist of the present invention. Also, depending on usage requirements or the like, some steps may be omitted.

A wiring board according to the first aspect of the present invention has the following: a core substrate having an accommodation section to accommodate an electronic component which has a substrate with an upper surface and a lower surface opposite the upper surface, a resin layer on the upper surface of the substrate and electrodes on the resin layer, while having a first surface and a second surface opposite the first surface; the electronic component accommodated in the accommodation section; first conductive circuits formed on the first surface of the core substrate; second conductive circuits formed on the second surface of the core substrate; a first interlayer resin insulation layer formed on the first surface of the core substrate, on the first conductive circuit and on the lower surface of the substrate of the electronic component; and a second interlayer resin insulation layer formed on the second surface of the core substrate, on the second conductive circuit and on the upper surface of the substrate of the electronic component. In such a wiring board, the amount of resin in the first interlayer resin insulation layer is greater than the amount of resin in the second interlayer resin insulation layer.

To be "a core substrate which accommodates an electronic component," it is sufficient if at least part of the electronic component is positioned inside the core substrate. For example, in addition to a structure in which the entire electronic component is completely built into the core substrate, it also includes a structure where only part of the electronic component is positioned in a recess formed in the core substrate.

A method for manufacturing a wiring board according to the second aspect of the present invention includes the following: in a core substrate having a first surface and a second surface opposite the first surface, forming an accommodation section to accommodate an electronic component which has a substrate with an upper surface and a lower surface opposite the upper surface, a resin layer formed on the upper surface of the substrate and electrodes formed on the resin layer; accommodating the electronic component in the accommodation section so that the lower surface of the substrate of the electronic component faces the same direction as the first surface of the core substrate; forming a first interlayer resin insulation layer on the first surface of the core substrate and the electronic component; and forming a second interlayer resin insulation layer on the second surface of the core substrate and the electronic component. The thickness of the first interlayer resin insulation layer is greater than the thickness of the second interlayer resin insulation layer.

Obviously, numerous modifications and variations of the present invention are possible in light of the above teachings. It is therefore to be understood that within the scope of the appended claims, the invention may be practiced otherwise than as specifically described herein.

What is claimed is:

1. A wiring board, comprising:
a core substrate having an accommodation portion and having a first surface and a second surface on an opposite side of the first surface;
an electronic component accommodated in the accommodation portion of the core substrate, the electronic component comprising a substrate, a resin layer formed on a surface of the substrate and an electrode formed on the resin layer;
a first interlayer resin insulation layer formed on the first surface of the core substrate and a surface of the substrate of the electronic component; and
a second interlayer resin insulation layer formed on the second surface of the core substrate and a surface of the substrate having the resin layer and electrode of the electronic component,
wherein the first interlayer resin insulation layer has a resin in an amount which is greater than an amount of a resin in the second interlayer resin insulation layer such that a total amount of a resin component including the resin in the first interlayer resin insulation layer is adjusted to be substantially same as a total amount of a resin component including the resin in the second interlayer resin insulation layer and a resin in the resin layer of the electronic component.

2. The wiring board according to claim 1, further comprising:
a first conductive circuit formed on the first surface of the core substrate; and
a second conductive circuit formed on the second surface of the core substrate.

3. The wiring board according to claim 1, wherein the first interlayer resin insulation layer has a thickness which is greater than a thickness of the second interlayer resin insulation layer.

4. The wiring board according to claim 1, wherein the core substrate has an area percentage which is occupied by the electronic component in a range of 50%~90%.

5. The wiring board according to claim 1, wherein the first interlayer resin insulation layer includes a reinforcing material, and the second interlayer resin insulation layer includes a reinforcing material.

6. The wiring board according to claim 1, wherein at least one of the first interlayer resin insulation layer and the second interlayer resin insulation layer includes a reinforcing material.

7. The wiring board according to claim 1, wherein at least one of the first interlayer resin insulation layer and the second interlayer resin insulation layer includes an inorganic particles.

8. The wiring board according to claim 1, wherein the resin in the first interlayer resin insulation layer has a thermal contraction coefficient which is substantially same as a thermal contraction coefficient of the second interlayer resin insulation layer.

9. The wiring board according to claim 1, further comprising:
a first conductive circuit formed on the first surface of the core substrate; and
a second conductive circuit formed on the second surface of the core substrate,
wherein the first interlayer resin insulation layer includes a reinforcing material, and the second interlayer resin insulation layer includes a reinforcing material.

10. The wiring board according to claim 1, wherein the first interlayer resin insulation layer has a thickness which is greater than a thickness of the second interlayer resin insulation layer, the first interlayer resin insulation layer includes a reinforcing material, and the second interlayer resin insulation layer includes a reinforcing material.

11. The wiring board according to claim 1, wherein the core substrate has an area percentage which is occupied by the electronic component in a range of 50%~90%, the first interlayer resin insulation layer includes a reinforcing material, and the second interlayer resin insulation layer includes a reinforcing material.

12. The wiring board according to claim 1, wherein the first interlayer resin insulation layer includes a reinforcing material, the second interlayer resin insulation layer includes a reinforcing material, and at least one of the first interlayer resin insulation layer and the second interlayer resin insulation layer includes an inorganic particles and has a portion filling a gap formed between the electronic component and the accommodation portion of the core substrate.

13. The wiring board according to claim 1, wherein at least one of the first interlayer resin insulation layer and the second interlayer resin insulation layer includes a reinforcing material and has a portion filling a gap formed between the electronic component and the accommodation portion of the core substrate.

14. The wiring board according to claim 1, wherein at least one of the first interlayer resin insulation layer and the second interlayer resin insulation layer includes a reinforcing material, has a portion filling a gap formed between the electronic component and the accommodation portion of the core substrate, and includes an inorganic particles.

15. The wiring board according to claim 1, wherein the resin in the first interlayer resin insulation layer has a thermal contraction coefficient which is substantially same as a thermal contraction coefficient of the second interlayer resin insulation layer, the first interlayer resin insulation layer includes a reinforcing material, and the second interlayer resin insulation layer includes a reinforcing material.

16. The wiring board according to claim 1, wherein the core substrate has an area percentage which is occupied by the electronic component in a range of 50%~90%, the first interlayer resin insulation layer includes a reinforcing material, the second interlayer resin insulation layer includes a reinforcing material, and at least one of the first interlayer resin insulation layer and the second interlayer resin insulation layer has a portion filling a gap formed between the electronic component and the accommodation portion of the core substrate.

17. The wiring board according to claim 1, wherein the core substrate has an area percentage which is occupied by the electronic component in a range of 50%~90%, and at least one of the first interlayer resin insulation layer and the second interlayer resin insulation layer includes a reinforcing material and has a portion filling a gap formed between the electronic component and the accommodation portion of the core substrate.

18. The wiring board according to claim 1, further comprising:
a first conductive circuit formed on the first surface of the core substrate; and
a second conductive circuit formed on the second surface of the core substrate,
wherein the first interlayer resin insulation layer includes a reinforcing material, the second interlayer resin insulation layer includes a reinforcing material, and at least one of the first interlayer resin insulation layer and the second interlayer resin insulation layer has a portion filling a gap formed between the electronic component and the accommodation portion of the core substrate.

19. The wiring board according to claim 1, further comprising:
a first conductive circuit formed on the first surface of the core substrate; and
a second conductive circuit formed on the second surface of the core substrate,
wherein the first interlayer resin insulation layer includes a reinforcing material, the second interlayer resin insulation layer includes a reinforcing material, the core substrate has an area percentage which is occupied by the electronic component in a range of 50%~90%, and at least one of the first interlayer resin insulation layer and the second interlayer resin insulation layer has a portion filling a gap formed between the electronic component and the accommodation portion of the core substrate.

20. The wiring board according to claim 1, wherein at least one of the first interlayer resin insulation layer and the second interlayer resin insulation layer has a portion filling a gap formed between the electronic component and the accommodation portion of the core substrate.

* * * * *